United States Patent [19]
Schaffer

[11] Patent Number: 5,880,638
[45] Date of Patent: Mar. 9, 1999

[54] RAIL-TO-RAIL OPERATIONAL AMPLIFIER AND METHOD FOR MAKING SAME

[75] Inventor: Gregory L. Schaffer, Cupertino, Calif.

[73] Assignee: Maxim Integrated Products, Sunnyvale, Calif.

[21] Appl. No.: 821,405

[22] Filed: Mar. 20, 1997

[51] Int. Cl.[6] ...................................................... H03F 3/45
[52] U.S. Cl. ......................... 330/255; 330/253; 330/261
[58] Field of Search .................................... 330/253, 255, 330/261

[56] References Cited

U.S. PATENT DOCUMENTS 4,241,313  12/1980  Takehara .................................. 330/253
5,412,309   5/1995  Ueunten ............................... 330/253 X Primary Examiner—James B. Mullins
Attorney, Agent, or Firm—Hickman & Martine, LLP

[57] ABSTRACT

Disclosed is an operational amplifier having a positive input terminal, a negative input terminal, an output terminal, a positive power supply input and a negative power supply input. The operational amplifier includes a transistor input pair being coupled to the positive input terminal and the negative input terminal. A first charge pump being coupled to positive supply circuitry contained within the operational amplifier. The first charge pump being configured to operate the positive supply circuitry contained within the operational amplifier at an enhanced positive power supply. The operational amplifier further includes a second charge pump being coupled to negative supply circuitry contained within the operational amplifier. The second charge pump being configured to operate the negative circuitry contained within the operational amplifier at an enhanced negative power supply. Accordingly, the transistor output pair provides an essentially full rail-to-rail output.

32 Claims, 5 Drawing Sheets

RAIL-TO-RAIL OPERATIONAL AMPLIFIER AND METHOD FOR MAKING SAME

BACKGROUND OF THE INVENTION

1. Field of the Invention

The present invention relates generally to integrated circuits, and more particularly to rail-to-rail operational amplifier circuits.

2. Description of the Related Art

Classical operational amplifiers (OP AMPs) are well known versatile electronic devices that are used in designing many types of electronic circuits. By way of example, when the terminals of a classical OP AMP are electrically interconnected with other components, the OP AMP may be used to make differentiating circuits, integrating circuits, gain-up circuits, gain-down circuits, etc. Typically, classical OP AMPs are powered-up with a negative power supply voltage (i.e., −5 V) and an upper rail power supply voltage (e.g., +5 V). In operation, a signal input voltage having a dominant common mode voltage and a differential voltage is typically input at the positive terminal of the classical OP AMP. In the classical OP AMP, the positive terminal (as well as the negative node) is typically connected to an internal single input transistor pair.

In this manner, the signal input voltage may range somewhere between the negative power supply voltage and the positive power supply voltage. In addition, the classical OP AMP has a pair of output transistors that typically have their sources (or emitters) tied together at an output node. In this manner, the output node of the classical OP AMP will be capable of producing output signals ranging from 1 volt to 2 volts above the negative power supply voltage and from 1 volt to 2 volts below the positive power supply voltage.

Although classical OP AMPs work well for circuits that only require operation between a negative power supply voltage and a positive power supply voltage, many circuits now demand that operational amplifiers provide rail-to-rail inputs and outputs. For example, rail-to-rail OP AMPs are ideally designed to receive signal input voltages ranging between the negative power supply and the positive power supply, including both. Circuit designers were therefore forced to modify the classical OP AMP design to enable inputs ranging between the negative rail and the positive rail, as well as providing outputs ranging between the same negative and positive rails. Unfortunately, current rail-to-rail circuit designs fall short of delivering "true" rail-to-rail performance.

FIG. 1A shows a conventional rail-to-rail OP AMP 10 that uses a cross-over circuit 20 to achieve input signal swings from rail-to-rail. In this example, "V" represents a positive rail, and "G" represents a negative rail. Conventional rail-to-rail OP AMP 10 is shown having an NPN differential pair 12 that is used for input voltages near a positive rail. NPN differential pair 12 generally includes an NPN transistor 28 and an NPN transistor 30 having their respective emitters coupled to a node that leads to cross-over circuit 20. Also shown is a PNP differential pair 14 that includes a PNP transistor 32 and a PNP transistor 34 that are used for input voltages near a negative rail. In this example, the emitters of PNP transistors 32 and 34 are shown coupled to cross-over circuit 20. The base terminals of NPN transistor 30 and PNP transistor 34 are coupled to a positive terminal 16, and the base terminals of NPN transistor 28 and PNP transistor 32 are coupled to a negative terminal 15.

The collector terminals of NPN differential pair 12 and PNP differential pair 14 are shown coupled to a folded cascode circuit 18. In general, folded cascode circuit 18 is used for combining output signals received from differential pairs 12 and 14, and for outputting the combined signals to an output stage 40. As shown, folded cascode circuit 18 and output stage 40 are coupled to a positive voltage supply (V) and a negative voltage supply (G). As described above, "G" represents a negative rail voltage, and "V" represents a positive rail voltage. Output stage 40 typically includes a PNP transistor 52 and an NPN 54 that are electrically coupled to a level shifter 56 at their base terminals. In general, when output stage 40 receives a HIGH, PNP transistor 52 is turned off and NPN transistor 54 is turned on. Conversely, when output stage 40 receives a LOW, NPN transistor 54 is turned off and PNP transistor 52 is turned on. Accordingly, the output is passed out through a common collector. As will be described below, the common collector output arrangement has the drawback that performance is strongly affected by the load. Thus, bandwidth, and stability tend to be affected by output loading.

FIG. 1B is a current and voltage plot illustrating the response of a current $I_1$ and a current $I_2$ of FIG. 1A with respect to signal input voltage. Because most signal input voltages tend to utilize the negative voltage levels and lower-positive voltage levels, cross-over circuit 20 is often configured to transition between current $I_1$ and $I_2$ at a transition location 62 that is about 1 volt away from a positive voltage supply (V). That is, current $I_2$ will be ON (i.e., PNP differential pair 14 is active) for signal input voltages ranging between the negative voltage supply (G) and up to the end of a cross-over range ($V_{CO}$). Conversely, current $I_1$ will be ON (i.e., NPN differential pair 12 is active) from the positive voltage supply (V) and down to the other end of the cross-over range ($V_{CO}$).

Although conventional rail-to-rail OP AMP 10 is capable of producing swings between positive and negative voltages, various errors are introduced which unfortunately handicap its rail-to-rail performance. It is important to realize that the input of conventional rail-to-rail OP AMP 10 is usually operating while either NPN differential pair 12 or PNP differential pair 14 is ON (except in $V_{CO}$, where both are ON). Unfortunately, the differential output current from differential pair 12 and the differential output current from PNP differential pair 14 have a tendency to vary due to well known voltage offset errors.

Because one transistor is rarely identical to another, the base-emitter voltages ($V_{BE}$) of NPN transistors 28 and 30 will likewise rarely match. Accordingly, the difference between the base-emitter voltage ($V_{BE}$) of NPN transistors 28 and 30 define an input offset voltage. The input offset voltage of NPN differential pair 12 will therefore produce an error current $I_{o1}$ (i.e., leading to folded cascode circuit 18) that takes into account the resulting offset voltage. Even if the offset errors are reduced (i.e., by trimming or the like) for NPN differential pair 12, PNP differential pair 14 will also have its associated offset voltage that produces its own unique current $I_{o2}$ (i.e., leading to folded cascode circuit 18). Although the difference between currents $I_{o1}$ and $I_{o2}$ may be small when viewed alone, at high gains, this difference is unfortunately magnified producing substantial gain nonlinearities.

The input of conventional rail-to-rail OP AMP 10 is also subject to input bias current errors. As is well known, the current gain (β) of the NPN transistors 28 and 30 tends to be larger than that of the PNP transistors 32 and 34. Accordingly, because the bias current is approximately ($I_E/β$), the bias current for the NPN's will differ from the PNP's because their betas (β) differ. To further complicate matters, the input bias current for NPN differential pair 12 and PNP differential pair 14 flow in opposite directions. That is, the input bias current flows into the bases for NPN transistors 28 and 30, and flows out of the bases for the PNP transistors 32 and 34. As an example, 10 nano amps may be flowing in one direction, and 20 nano amps may be flowing in the other direction. As can be appreciated, the changes in magnitude and direction of the input currents produce input bias current errors that unfortunately introduce errors at the output.

Of course, the NPN differential pair 12 and PNP differential pair 14 may be replaced with MOSFETs. When MOSFETs are used, N-channel transistors are used in place of NPN transistors 28 and 30, and P-channel transistors are used in place of PNP transistors 32 and 34. Although input bias current errors described above are insignificant, the input voltage offset errors produced by MOSFETs may be an order of magnitude greater than with bipolar transistors. In addition, it is generally well known that transition location 62 (of FIG. 1B) is substantially less uniform when MOSFETs are used. As a result, the bipolar transistors of FIG. 1A and their associated drawbacks are preferred over their MOSFET counterparts. In addition, the transconductance of the input stage tends to change during cross-over. As a result of transconductance changes, a change in bandwidth may be caused, which may lead to instability in some applications having capacitive loads.

As described above, the collectors of PNP transistor 52 and NPN transistor 54 must be tied together in order to achieve an output that swings rail-to-rail. However, the rail-to-rail swings never truly extend all the way to the positive rail and the negative rail. In optimum operation, the positive and negative rail swing is about a collector-emitter saturation voltage ($V_{CE\ SAT}$) away. By way of example, at lower currents, $V_{CE\ SAT}$ may be as small as 0.1 volts, and at higher currents as large as 0.5 volts. Accordingly, the output swing will never be a true rail-to-rail swing. The limited rail-to-rail swing is sometimes referred to as "headroom," which refers to voltage difference between a limited rail-to-rail voltage swing and a "full-ideal" rail-to-rail voltage swing.

In addition, the common collector output stage requirement of conventional rail-to-rail OP AMP 10 suffers from being very load dependent, because the common collector output stage has a high output impedance. As a result, conventional rail-to-rail OP AMP 10 has a tendency to oscillate with capacitive loads which makes it difficult to stabilize. Further yet, more power is consumed in order to provide conventional rail-to-rail OP AMP 10 sufficient drive capacity.

In view of the foregoing, there is a needed for operational amplifiers that substantially eliminate input voltage offset errors, input bias current errors as well as provide a true rail-to-rail output while reducing output loading sensitivity.

SUMMARY OF THE INVENTION

Broadly speaking, the present invention fills these needs by providing an operational amplifier capable of providing a full rail-to-rail output. It should be appreciated that the present invention can be implemented in numerous ways, including as a method, a process, a system, an apparatus, or a device. Several inventive embodiments of the present invention are described below.

In one embodiment, an operational amplifier having a positive input terminal, a negative input terminal, an output terminal, a positive power supply input and a negative power supply input is disclosed. The operational amplifier includes a transistor input pair being coupled to the positive input terminal and the negative input terminal. A first charge pump being coupled to positive supply circuitry contained within the operational amplifier. The first charge pump being configured to operate the positive supply circuitry contained within the operational amplifier at an enhanced positive power supply. The operational amplifier further includes a second charge pump being coupled to negative supply circuitry contained within the operational amplifier. The second charge pump being configured to operate the negative circuitry contained within the operational amplifier at an enhanced negative power supply. Accordingly, the transistor output pair provides an essentially full rail-to-rail output.

In another embodiment, an amplifier is disclosed. The amplifier includes an amplification stage having a positive signal input, a negative signal input, and an output, the amplification stage being powered from a positive power input and a negative power input. A first charge pump having an input coupled to the positive power input to develop a voltage greater than the voltage of the positive power input. The first charge pump having an output coupled to the amplification stage. The amplifier further includes a second charge pump having an input coupled to the positive power input to develop a voltage less than the voltage of the negative power input. The second charge pump having an output coupled to the amplification stage. The amplifier thereby provides an essentially full rail-to-rail output.

In yet a further embodiment, a method for making a rail-to-rail operational amplifier is disclosed. The rail-to-rail operational amplifier includes a positive input terminal, a negative input terminal and an output terminal. The rail-to-rail operational amplifier is configured to receive a positive power supply and a negative power supply. The method includes providing a first internal charge pump for driving positive biased circuitry contained within the operational amplifier. The first charge pump being configured to operate the positive biased circuitry at an enhanced positive power supply. The method further includes providing a second charge pump for driving negative biased circuitry contained within the operational amplifier. The second charge pump being configured to operate the negative biased circuitry at an enhanced negative power supply. Furthermore, the method includes arranging an output stage of the rail-to-rail operational amplifier to receive an enhanced gate drive that is more positive than the positive power supply and more negative than the negative power supply. The enhanced gate drive being configured to allow a true rail-to-rail output by implementing output FETs (e.g., P-channel and N-channel) connected in a push-pull common source circuit.

In still a further embodiment, an operational amplifier having a positive input terminal, a negative input terminal and an output terminal is disclosed. The operational amplifier being configured to receive a positive power supply and a negative power supply. The operational amplifier includes means for driving circuitry contained within the operational amplifier at an enhanced positive power supply, means for driving the circuitry contained within the operational amplifier at an enhanced negative power supply. The operational amplifier further includes an output means for receiving an enhanced gate drive signal from the circuitry contained within the operational amplifier. The enhanced gate drive being more positive than the positive power supply and more negative than the negative power supply. The enhanced gate drive being configured to drive the output means to an essentially full rail-to-rail output.

As an advantage, the amplifier in its various embodiments may include an amplification stage having a positive signal input, a negative signal input, and an output. In one embodiment, the amplification stage is preferably powered from an enhanced positive power supply, and an enhanced negative power supply. These enhanced power supply voltages are developed by two internal charge pumps (or the like) operating from the positive signal input and the negative signal input (ie., the amplifier's power supply rails). In this manner, the output of the amplification stage swings between the enhanced power supplies. As can be appreciated, this enhanced swing allows a signal to drive the gates of two output field effect transistors whose sources swing rail-to-rail. In a preferred implementation, the drains of the two output field effect transistors are connected to the power supply rails. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

An operational amplifier capable of accommodating rail-to-rail input signals and providing a full rail-to-rail output is disclosed. The operational amplifier preferably includes first and second charge pumps for driving circuitry internal to the operational amplifier at voltages that are enhanced beyond the positive and negative supply voltages. By driving internal circuitry at enhanced voltage levels, the output stage of the operational amplifier is capable of supplying a full rail-to-rail output. In the following description, numerous specific details are set forth in order to provide a thorough understanding of the present invention. It will be understood, however, to one skilled in the art, that the present invention may be practiced without limitation to some or all of these specific details. In other instances, well known process operations have not been described in detail in order not to unnecessarily obscure the present invention.

Figure 1A:
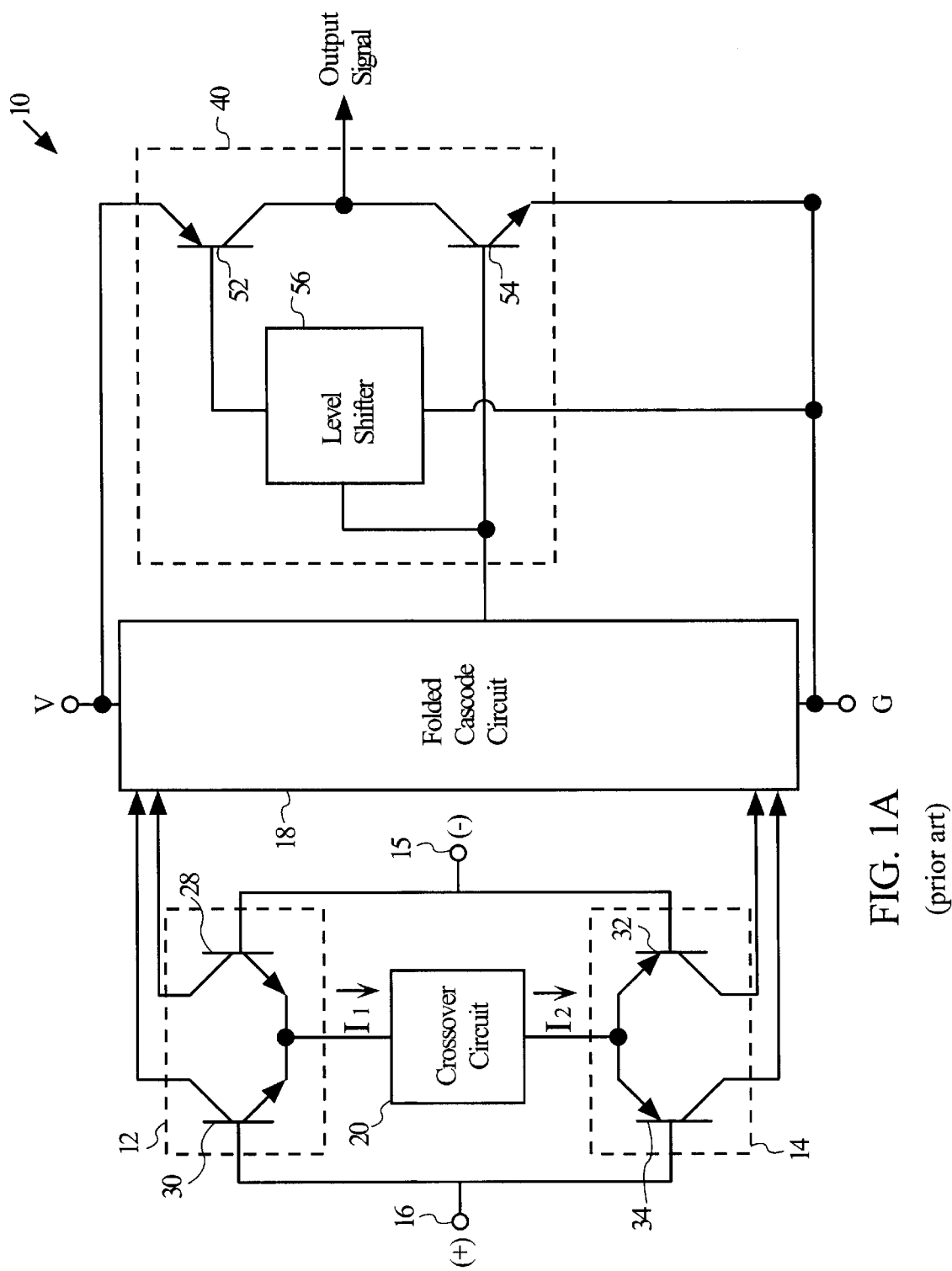
FIG. 1A shows a conventional rail-to-rail operational amplifier having a cross-over circuit for swings from rail-to-rail.
Figure 1B:
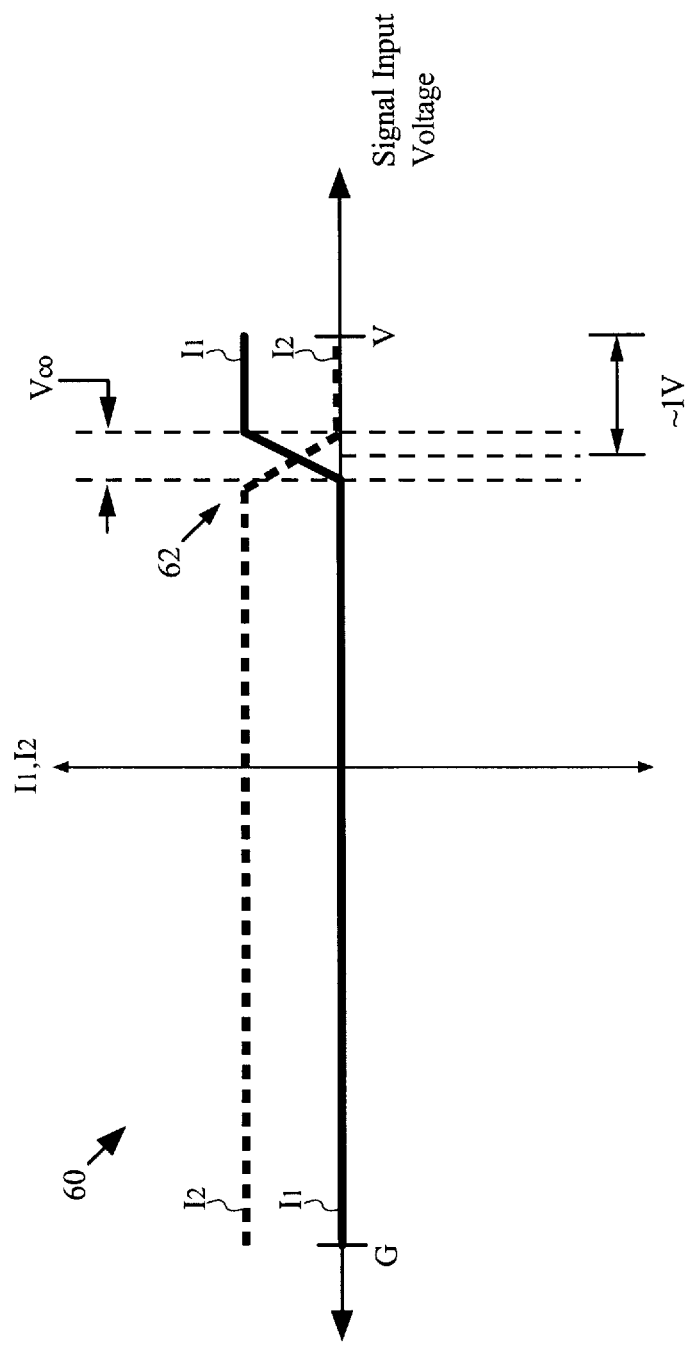
FIG. 1B is a current and voltage plot illustrating the response of a current I₁ and a current I₂ of FIG. 1A with respect to input signal common mode voltage.
Figure 2:
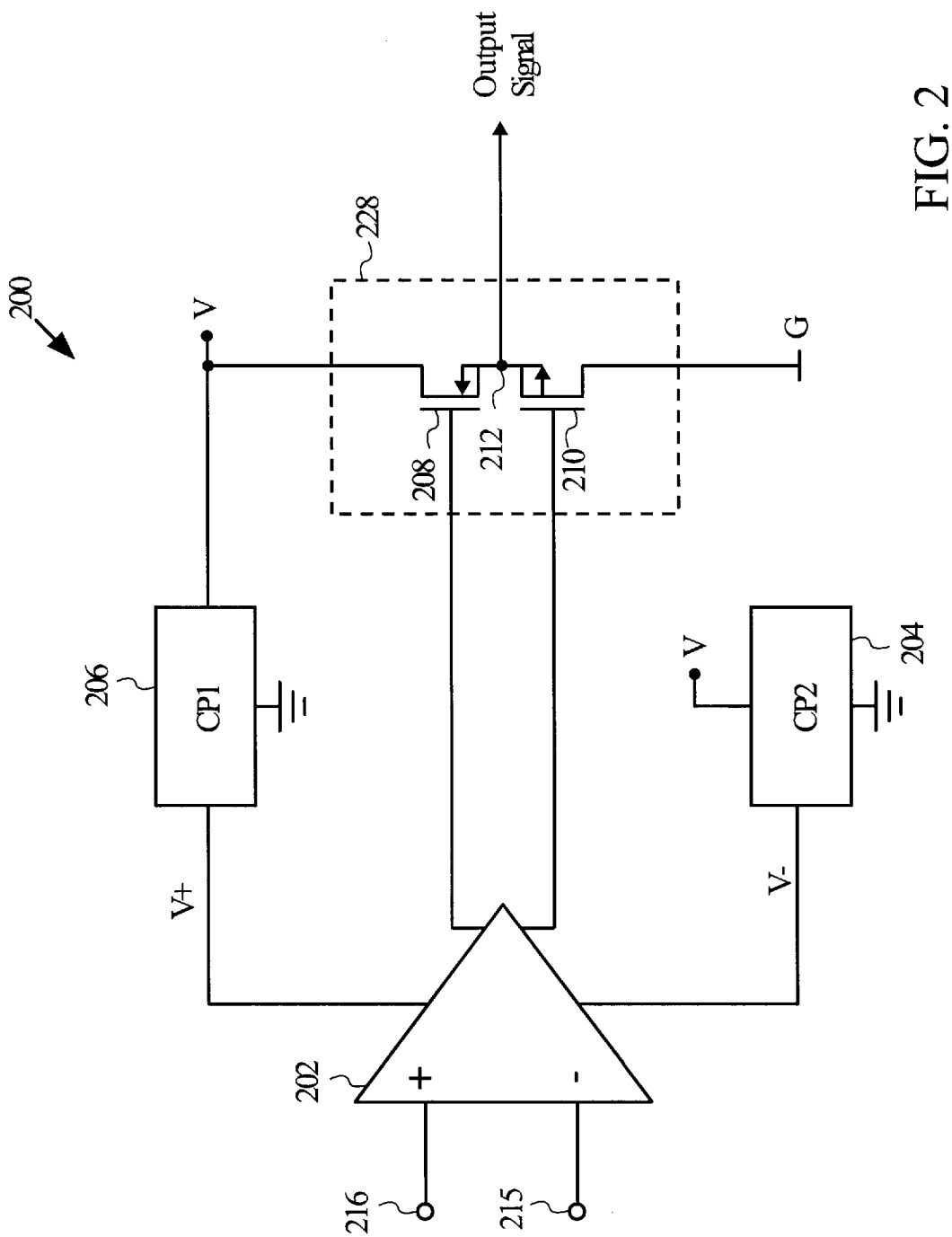
FIG. 2 is a rail-to-rail operational amplifier in accordance with one embodiment of the present invention.

FIG. 2 is a rail-to-rail operational amplifier (OP AMP) 200 in accordance with one embodiment of the present invention. As shown, rail-to-rail OP AMP 200 includes a voltage enhanced circuit 202 having a positive terminal 216 and a negative terminal 215. Voltage enhanced circuit 202 is shown coupled to a charge pump (CP1) 206 and a charge pump (CP2) 204. Preferably, CP1 206 is also coupled to a positive voltage supply (V), and ground. Likewise, CP2 204 is preferably coupled to the positive voltage supply (V) and ground.

In this embodiment, CP1 206 and CP2 204 are configured to provide an enhanced positive voltage supply (V+) and an enhanced negative voltage supply (V−), respectively, to voltage enhanced circuit 202. In this manner, voltage enhanced circuit 202 will preferably operate at the enhanced voltage levels so as to provide output signals that are provided to an output pair 228. As shown, output pair 228 includes an N-channel transistor 208 and a P-channel transistor 210 that have their sources coupled at a node 212 that defines an output. The drain of N-channel transistor 208 is preferably coupled to the positive voltage supply (V) and the drain of P-channel transistor 210 is coupled to a negative voltage supply (G). In this embodiment, the positive voltage supply (V) and negative voltage supply (G) represent a positive rail voltage and a negative rail voltage respectively. By way of example, positive voltage supply (V) may be +5 volts, and negative voltage supply (G) may be −5 volts. That is, (V) is preferably a voltage that is more positive than the voltage of (G). As such, (V) may be +5 volts, and (G) may be 0 volts or any other combination defining a upper rail and an lower rail. Of course, it should be understood that these supply voltages are merely exemplary and any suitable positive and negative supply voltage may be used.

In one embodiment, charge pump (CP1) 206 is preferably configured to produce a voltage that is greater than the positive voltage supply (V). By way of example, the enhanced positive voltage supply (V+) may be between about 1.5 volts more positive than (V) to about 5 volts more positive than (V). In a preferred embodiment, the enhanced positive voltage supply (V+) is about 3 volts more positive than (V). In a like manner, the enhanced negative voltage supply (V−) may be between about 1.5 volts more negative than (G) to about 5 volts more negative than (G). In a preferred embodiment, the enhanced negative voltage supply (V−) is about 3 volts more negative than (G). Of course, more positive and more negative enhanced voltages may be implemented as well.

By way of example, if the positive voltage supply (V) is +5 volts, and negative voltage supply (G) is −5 volts, the enhanced positive supply is preferably about +8 volts and the enhanced negative supply is preferably about −8 volts. In yet a further example, if the positive voltage supply (V) is +5 volts, and negative voltage supply (G) is 0 volts, the enhanced positive supply is preferably about +8 volts and the enhanced negative supply is preferably about −3 volts. In this manner, all of the components within enhanced circuit 202 operate at an enhanced voltage level just before the signal is passed to output pair 228.

Advantageously, operating enhanced circuit 202 on enhanced voltage levels enables the output signal of output pair 228 to swing full rail-to-rail. In other words, the gate drive provided to N-channel transistor 208 or P-channel transistor 210 is beyond the positive and negative supply when the respective transistor is on. As a further advantage, output pair 228 provides a common source output that is less sensitive to output loading which makes rail-to-rail OP AMP 200 much more stable for different capacitive loads. Specifically, the headroom limitations of the prior art are eliminated because output pair 228 is driven with substantially enhanced gate drives.

Figure 3:
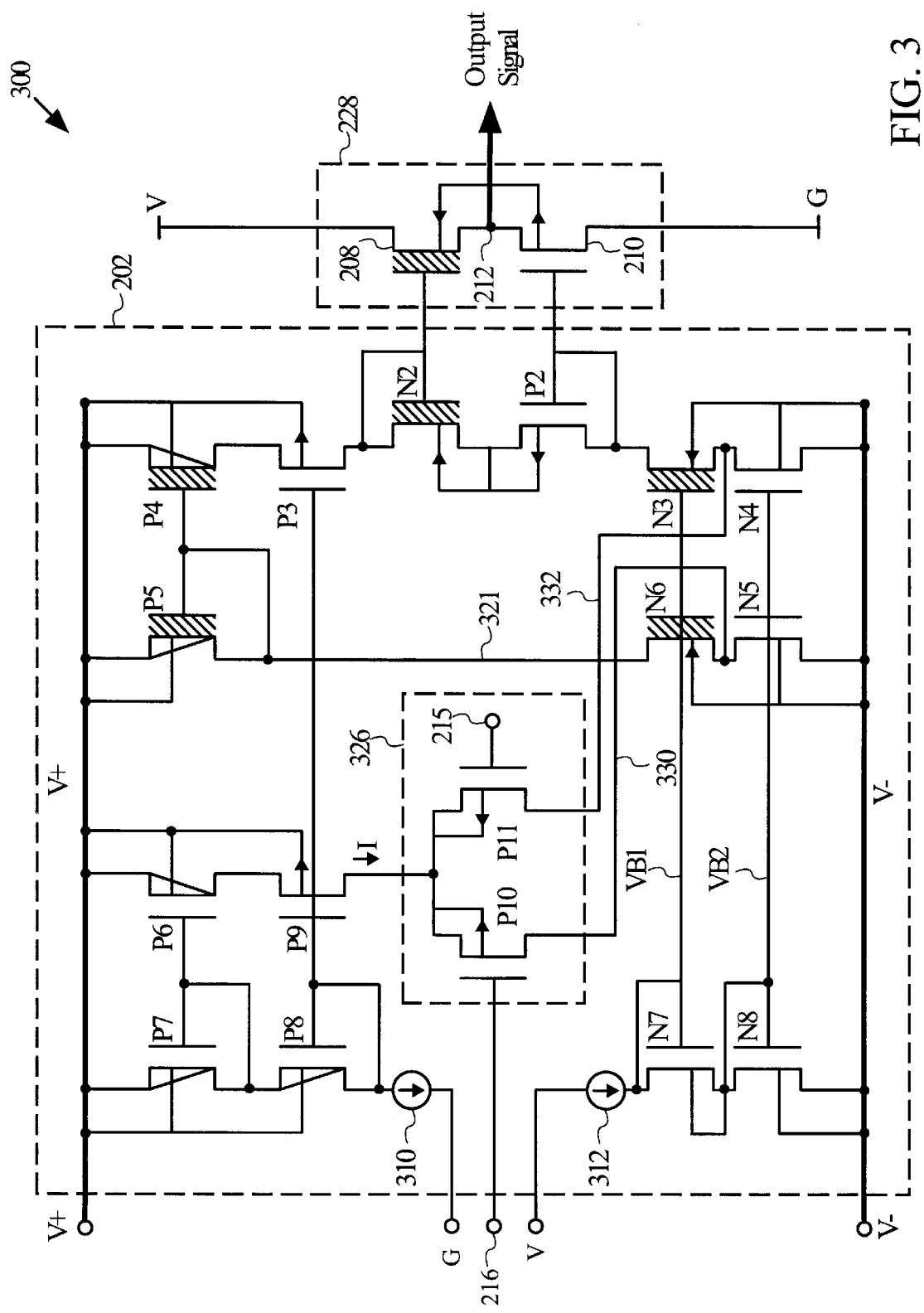
FIG. 3 is a circuit diagram of rail-to-rail operational amplifier of FIG. 2 in accordance with one embodiment of the present invention.

FIG. 3 is a circuit diagram of a rail-to-rail operational amplifier 300 in accordance with one embodiment of the present invention. In this embodiment, the internal circuitry of voltage enhanced circuit 202 is shown coupled to an enhanced positive voltage supply (V+) and an enhanced negative voltage supply (V−) which advantageously produces stronger gate drives to the output pair 228 to enable a full rail-to-rail output. As shown, negative voltage supply (G) is coupled to a current source 310 that is connected to a current mirror represented by transistors P6, P7, P8, and P9. The output of transistor P9 therefore provides a current (I) that is fed into an input pair 326.

Input pair 326 preferably includes a transistor P10 having its gate coupled to a positive input terminal 216 and a transistor P11 having its gate coupled to a negative input terminal 215. The drain of transistor P10 is also coupled between a transistor N5 and a transistor N6 via a line 330. In a like manner, the drain of transistor P11 is coupled between a transistor N3 and a transistor N4 via a line 332. In this embodiment, transistors N3, N4, N5, and N6 form a folded cascode circuit that is shown coupled to the enhanced voltage supply (V−).

Further, transistors P3, P4, and P5 form part of a current mirror that is coupled to the enhanced positive voltage supply (V+). Transistor P5 is also coupled to transistor N6 via a line 321. In this embodiment, positive voltage supply (V) is shown coupled to a current supply 312 that is in turn coupled to biasing transistors N7 and N8. In operation, transistors N7 and N8 are configured to provide biasing voltages (VB1) and (VB2) to transistors N6 and N3, and transistors N5, and N4 respectively. Also shown is transistor N2 having its gate and drain to transistor P3 and its source coupled to the source of transistor P2. Transistor P2 is also coupled to the drain of transistor N3 of the folded cascode circuit.

Accordingly, the entire circuitry contained within voltage enhanced circuit 202 functions on voltages that are enhanced above the positive voltage supply (V) and below the negative voltage supply (G). In this manner, transistors P2 or N2 may provide a gate drive to P-channel transistor 210 or N-channel transistor 208 that is greater than the negative and positive voltage supplies. Accordingly, output pair 228 is advantageously suited for providing a full rail-to-rail output. In addition, because the sources of N-channel transistor 208 and P-channel transistor 210 are tied together at output node 212, a lower impedance is produce when looking into the output, and this reduces its sensitivity to output loading.

It is important to realize that no cross over circuitry is required in providing a full rail-to-rail output from operational amplifier 300. As a result, no input voltage offset errors associated with cross over circuitry are introduced when transistors P10 and P11 of input pair 326 are implemented. Accordingly, any gain nonlinearities are advantageously prevented. Further, the resulting rail-to-rail operational amplifier 300 resembles a classic operational amplifier. That is, when rail-to-rail operational amplifier 300 is viewed in terms of its inputs and outputs, the interfacing components generally provide the simplicity of a classical operational amplifier (e.g., a single input pair, positive voltage supply (V), negative voltage supply (G) and an output pair having its sources tied together) while providing a true rail-to-rail output swing. In other words, the enhanced voltage operation of voltage enhanced circuit 202 is essentially non-apparent due to the voltage enhancements provided by the internal charge pumps CP1 206 and CP2 204.

Although exemplary transistor interconnections were provided for voltage enhanced circuit 202, it should be understood that the implemented transistor interconnections may be changed or modified while maintaining the benefits of voltage enhanced operation.

Figure 4:
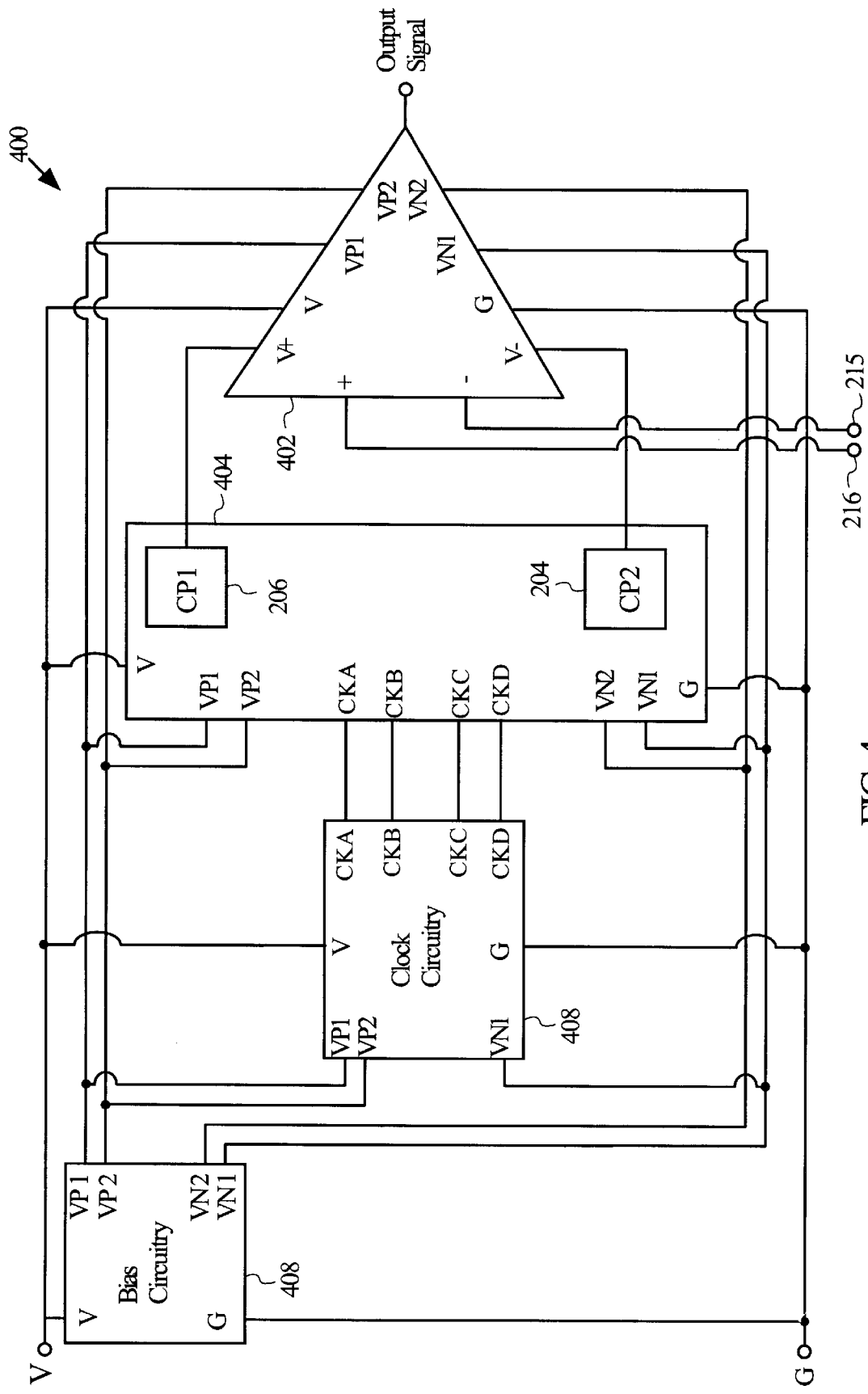
FIG. 4 shows an exemplary schematic for implementing a rail-to-rail operational amplifier in accordance with one embodiment of this invention.

FIG. 4 shows an exemplary schematic 400 for implementing a rail-to-rail operational amplifier in accordance with one embodiment of this invention. As shown, rail-to-rail operational amplifier is provided with a positive voltage supply (V) and a negative voltage supply (G) for driving a bias circuit 408, a clock circuit 406 and a pump circuitry block 404. The positive input terminal 216 and the negative input terminal 215 are shown coupled to the inputs to an OP AMP 402. In general, OP AMP 402 preferably includes the exemplary circuitry contained within voltage enhanced circuit 202 and output pair 228 of FIG. 3.

By way of example, OP AMP 402 is shown receiving an enhanced voltage supply (V+) from charge pump (CP1) 206 and an enhanced negative power supply (V−) from a charge pump (CP2) 204. In this embodiment, CP1 206 and CP2 204 are contained within pump circuitry block 404. Pump circuitry block 404 is shown having terminals that connect to clock circuitry 406 for controlling the timing associated with the operation of CP1 206 and CP2 204. As is well known, the charge pumps essentially function as a capacitor that may be charged up across a line, and then discharged to produce the desired enhanced voltage supplies. Accordingly, the clock circuitry 406 ensures that the charge pumps are appropriately charging and discharging in a correct order.

The biasing circuitry 408 is shown coupled to clock circuitry 406, pump circuitry block 404 and OP AMP 402. Although only one OP AMP 402 and one pump circuitry block 404 are shown, it should be understood that any number of OP AMPs 402 and pump circuitry blocks 404 may be implemented to produce multiple true rail-to-rail operational amplifier stages.

Although the foregoing invention has been described in some detail for purposes of clarity of understanding, it will be apparent that certain changes and modifications may be practiced within the scope of the appended claims. In addition, it should be understood that the various circuit diagrams may be embodied in any form which may include, for example, any suitable semiconductor substrate, printed circuit board, packaged integrated circuit, or software implementation. Accordingly, the present embodiments are to be considered as illustrative and not restrictive, and the invention is not to be limited to the details given herein, but may be modified within the scope and equivalents of the appended claims.

What is claimed is:

1. An operational amplifier having a positive input terminal, a negative input terminal, an output terminal, a positive power supply input and a negative power supply input, comprising:

a transistor input pair having transistor gates that are respectively coupled to the positive input terminal and the negative input terminal of the operational amplifier;

a first charge pump being coupled to positive supply circuitry contained within the operational amplifier, the first charge pump being configured to operate the positive supply circuitry contained within the operational amplifier at an enhanced positive power supply that is more positive than a positive power supply; and a second charge pump being coupled to negative supply circuitry contained within the operational amplifier, the second charge pump being configured to operate the negative supply circuitry contained within the operational amplifier at an enhanced negative power supply that is more negative than a negative power supply;

whereby the operational amplifier is capable of delivering an essential full rail-to-rail output.

2. An operation amplifier as recited in claim 1, further comprising a transistor output pair having gates that couple to the output terminal of the operational amplifier, the transistor output pair being configured to receive a drive signal from each of the positive and negative supply circuitry that operates on the enhanced positive power supply and the enhanced negative supply.

3. An operational amplifier as recited in claim 2, wherein the transistor input pair is a single differential pair.

4. An operational amplifier as recited in claim 3, wherein the enhanced positive power supply is between about 1.5 volts and about 5 volts more positive than the positive power supply input.

5. An operational amplifier as recited in claim 3, wherein the enhanced negative power supply is between about 1.5 volts and about 5 volts more negative than the negative power supply input.

6. An operational amplifier as recited in claim 2, wherein the transistor output pair is coupled at a common source output node, and the transistor output pair has gates that are configured to receive the drive signal from each of the positive and negative supply circuitry.

7. An operational amplifier as recited in claim 1, wherein the positive supply circuitry includes a first current mirror configured to provide a current into the transistor input pair.

8. An operational amplifier as recited in claim 7, further comprising a first current source coupled between the negative power supply input and the first current mirror.

9. An operational amplifier as recited in claim 2, wherein the positive supply circuitry includes a second current mirror configured to provide a first output current to a first enhanced output transistor, the first enhanced output transistor being coupled to a first gate of the transistor output pair.

10. An operational amplifier as recited in claim 9, wherein the first enhanced output transistor is an n-channel transistor.

11. An operational amplifier as recited in claim 10, wherein the negative supply circuitry includes biasing transistors that are coupled to a second current source, the second current source being coupled to the positive power supply input.

12. An operational amplifier as recited in claim 11, wherein the negative supply circuitry includes a folded cascode circuit that is coupled to the biasing transistors, the transistor input pair and the second current mirror.

13. An operational amplifier as recited in claim 12, wherein the folded cascode is configured to provide a second output voltage to a second enhanced output transistor, the second enhanced output transistor being coupled to a second gate of the transistor output pair.

14. An operational amplifier as recited in claim 13, wherein the second enhanced output transistor is a p-channel transistor.

15. An operational amplifier as recited in claim 13, wherein the first charge pump and the second charge pump are coupled to a clock circuit, the clock circuit being configured to control the operation of the first and second charge pumps.

16. An amplifier, comprising:
   an amplification stage having a positive signal input, a negative signal input, and an output, said amplification stage being powered from an enhanced positive power input and an enhanced negative power input;
   a first charge pump having an input coupled to a positive power input to develop a voltage greater than the voltage of said positive power input, said first charge pump having an output that is configured to provide the developed voltage that is greater than the voltage of said positive power input to a positive enhanced voltage rail (V+) that is part of said amplification stage; and
   a second charge pump having an input coupled to the positive power input to develop a voltage less than the voltage of said negative power input, said second charge pump having an output that is configured to provide the developed voltage that is less than the voltage of said negative power input to a negative enhanced voltage rail (V−) that is part of said amplification stage;
   whereby an essentially full rail-to-rail output between said positive power input of said negative power input is provided at said output of said amplification stage.

17. An amplifier as recited in claim 16, wherein the voltage greater than the voltage of said positive power input is between about 1.5 volts and about 5 volts more positive.

18. An amplifier as recited in claim 16, wherein the voltage less than the voltage of said negative power input is between about 1.5 volts and about 5 volts more negative.

19. An amplifier as recited in claim 16, wherein the amplification stage further includes a single input pair configured to receive inputs from the positive signal input and the negative signal input.

20. An amplifier as recited in claim 19, wherein the amplification stage is coupled to a transistor output pair that is configured to receive elevated drive from the amplification stage.

21. A method for making a rail-to-rail operational amplifier, the rail-to-rail operational amplifier having a positive input terminal, a negative input terminal and an output terminal, the rail-to-rail operational amplifier is configured to receive a positive power supply and a negative power supply, comprising:
   providing a first internal charge pump for driving positive biased circuitry contained within the operational amplifier, the first charge pump being configured to operate the positive biased circuitry at an enhanced positive power supply that is more positive than the positive power supply;
   providing a second charge pump for driving negative biased circuitry contained within the operational amplifier, the second charge pump being configured to operate the negative biased circuitry at an enhanced negative power supply that is more negative than the negative power supply; and
   arranging an output stage to receive an enhanced gate drive from the output terminal that is configured to drive a pair of gates of the output stage such that a true rail-to-rail output can be realized between the positive power supply and the negative power supply of the output stage.

22. A method for making a rail-to-rail operational amplifier as recited in claim 21, further comprising:
   wiring the positive input terminal and the negative input terminal to a differential pair that is part of the rail-to-rail operational amplifier; and
   operating the differential pair between the enhanced positive power supply and the enhanced negative power supply.

23. A method for making a rail-to-rail operational amplifier as recited in claim 22, further comprising:
   connecting a pair of output transistors contained within the output stage such that a source of each of the pair of output transistors defines the output terminal of the rail-to-rail operational amplifier.

24. A method for making a rail-to-rail operational amplifier as recited in claim 23, wherein the output terminal produces a load independent output.

25. A method for making a rail-to-rail operational amplifier as recited in claim 23, further comprising:

regulating the enhanced positive power supply to be between about 1.5 volts and 5 volts more positive than the positive power supply.

26. A method for making a rail-to-rail operational amplifier as recited in claim 23, further comprising:

regulating the enhanced negative power supply to be between about 1.5 volts and 5 volts more negative than the negative power supply.

27. An integrated circuit including an operational amplifier made by the process of claim 21.

28. An operational amplifier having a positive input terminal, a negative input terminal and an output terminal, the operational amplifier being configured to receive a positive power supply and a negative power supply, comprising:

a first charge pumping means for driving circuitry contained within the operational amplifier at an enhanced positive power supply;

a second charge pumping means for driving the circuitry contained within the operational amplifier at an enhanced negative power supply;

an output means for receiving an enhanced gate drive signal from the circuitry contained within the operational amplifier, the enhanced gate drive being greater than the positive power supply and less than the negative power supply, the enhanced gate drive being configured to drive the output means to an essentially full rail-to-rail output; and a pair of transistor input means is configured to receive the positive input terminal and the negative input terminal, the pair of transistor input means is configured to operate between the enhanced positive power supply and the enhanced negative power supply.

29. An operational amplifier as recited in claim 28, wherein the enhanced positive power supply is between about 1.5 volts and 5 volts more positive than the positive power supply.

30. An operational amplifier as recited in claim 28, wherein the enhanced negative power supply is between about 1.5 volts and 5 volts more negative than the negative power supply.

31. A full rail-to-rail amplifying stage including an operational amplifier having a positive input terminal, a negative input terminal, an output terminal, a positive power supply input and a negative power supply input, comprising:

a transistor input pair having transistor gates that are respectively coupled to the positive input terminal and the negative input terminal of the operational amplifier;

a first charge pump being coupled to positive supply circuitry contained within the operational amplifier, the first charge pump being configured to operate the positive supply circuitry contained within the operational amplifier at an enhanced positive power supply that is more positive than a positive power supply;

a second charge pump being coupled to negative supply circuitry contained within the operational amplifier, the second charge pump being configured to operate the negative circuitry contained within the operational amplifier at an enhanced negative power supply that is more negative than a negative power supply; and a transistor output pair having gates that couple to the output terminal of the operational amplifier, the transistor output pair is configured to receive a drive signal from each of the positive and negative supply circuitry that operates on the enhanced positive power supply and the enhanced negative supply.

32. A full rail-to-rail amplifying stage as recited in claim 31, wherein the transistor output pair is coupled at a common source output node, and the transistor output pair has gates that are configured to receive the drive signal from each of the positive and negative supply circuitry.

* * * * *